United States Patent [19]
Suguro

[11] Patent Number: 6,033,537
[45] Date of Patent: Mar. 7, 2000

[54] SPUTTERING TARGET AND METHOD OF MANUFACTURING A SEMICONDUCTOR DEVICE

[75] Inventor: Kyoichi Suguro, Yokohama, Japan

[73] Assignee: Kabushiki Kaisha Toshiba, Kawasaki, Japan

[21] Appl. No.: 08/996,399

[22] Filed: Dec. 22, 1997

[30] Foreign Application Priority Data

Dec. 26, 1996 [JP] Japan .................................. 8-348959

[51] Int. Cl.⁷ .................................................. C23C 14/34
[52] U.S. Cl. .................................. 204/192.2; 204/192.12; 204/192.23; 204/192.25; 204/192.22; 204/192.15; 438/584; 438/762; 438/763; 438/765
[58] Field of Search ........................ 204/192.15, 192.22, 204/192.23, 192.25, 298.13, 192.12, 192.2; 420/435; 148/306, 307, 312, 313; 438/584, 762, 763, 765

[56] References Cited

U.S. PATENT DOCUMENTS

| | | | |
|---|---|---|---|
| 3,972,748 | 8/1976 | Livingston | 148/32 |
| 4,002,546 | 1/1977 | Shirahata et al. | 204/192 |
| 4,014,772 | 3/1977 | Woods et al. | 204/180 R |
| 4,049,522 | 9/1977 | Ainslie et al. | 204/192 M |
| 4,144,059 | 3/1979 | Liu et al. | 75/170 |
| 4,231,816 | 11/1980 | Cuomo et al. | 148/31.55 |
| 4,396,575 | 8/1983 | Aboaf et al. | 420/440 |
| 4,475,961 | 10/1984 | Jin | 148/31.55 |
| 4,695,333 | 9/1987 | Inoue et al. | 148/306 |
| 4,842,657 | 6/1989 | Masumoto et al. | 148/403 |
| 4,972,285 | 11/1990 | Otomo et al. | 360/120 |
| 5,028,280 | 7/1991 | Ihara et al. | 148/306 |
| 5,084,795 | 1/1992 | Sakakima et al. | 360/120 |
| 5,154,983 | 10/1992 | Watanabe | 428/611 |
| 5,211,767 | 5/1993 | Shigeta et al. | 148/121 |
| 5,334,267 | 8/1994 | Taniguchi et al. | 148/425 |
| 5,478,416 | 12/1995 | Takaoka et al. | 148/306 |
| 5,561,307 | 10/1996 | Mihara et al. | 257/295 |
| 5,587,026 | 12/1996 | Iwasaki et al. | 148/313 |
| 5,631,094 | 5/1997 | Ranjan et al. | 428/611 |
| 5,728,279 | 3/1998 | Schlott et al. | 204/298.13 |
| 5,858,125 | 1/1999 | Hasegawa | 148/304 |

FOREIGN PATENT DOCUMENTS

| | | | |
|---|---|---|---|
| 48/11448 | 4/1973 | Japan | C21C 1/00 |
| 53-135818 | 11/1978 | Japan | C22C 19/03 |
| 57-54252 | 3/1982 | Japan | C22C 38/18 |
| 4-276070 | 10/1992 | Japan | C23C 14/35 |

*Primary Examiner*—Nam Nguyen
*Assistant Examiner*—Steven H. Versteeg
*Attorney, Agent, or Firm*—Finnegan, Henderson, Farabow, Garrett & Dunner, L.L.P.

[57] ABSTRACT

A sputtering target comprising a main component having magnetic properties and consisting of a metal or an alloy, and a sub-component comprising at least one component selected from the group consisting of a non-magnetic metal and a semiconductor. The main component may be a metal selected from the group consisting of Co, Ni and Fe or may be an alloy of at least two metals selected from the group consisting of Co, Ni and Fe. The sub-component may comprise at least one nonmagnetic metal selected from the group consisting of Ti, Zr, Hf, V, Nb, Ta, Cr, Sn and Pb, or may comprise at least one semiconductor selected from the group consisting of Si and Ge, or may be a mixture of the at least one nonmagnetic metal and the at least one semiconductor.

20 Claims, 11 Drawing Sheets

SPUTTERING TARGET AND METHOD OF MANUFACTURING A SEMICONDUCTOR DEVICE

BACKGROUND OF THE INVENTION

The present invention relates to a sputtering target and a method of manufacturing a semiconductor device.

Large-scale integrated circuits (LSIs), each incorporating a number of transistors, resistors and the like which are connected, forming electric circuits on a single chip, are widely used as major components of an electronic apparatus such as a computer or a communications apparatus. The performance of the electronic apparatus largely depends on the performance of each LSI. The performance of an LSI can be enhanced by increasing the integration density, or by minimizing the size of each circuit element.

To minimizing the size of a circuit elements, e.g., a MOS field-effect transistor (hereinafter referred to as "MOS transistor"), it is necessary to reduce the gate length and the thickness of the source/drain diffusion layer.

Known as a method of forming a shallow source-drain diffusion layer is low-acceleration ion implantation. This method can form a shallow source/drain diffusion layer as thin as 0.1 $\mu$m or less.

However, a source/drain diffusion layer formed by the low-acceleration ion implantation has a sheet resistance of 100 $\Omega/\square$ or more. If a circuit element has so high a sheet resistance, it cannot operate at high speed. To enable the element to operate at high speed, a recently developed method called "salicidation" may be employed. In this method, a silicide layer is deposited in self-aligned fashion on the surface of the source/drain diffusion layer.

Figure 1A:
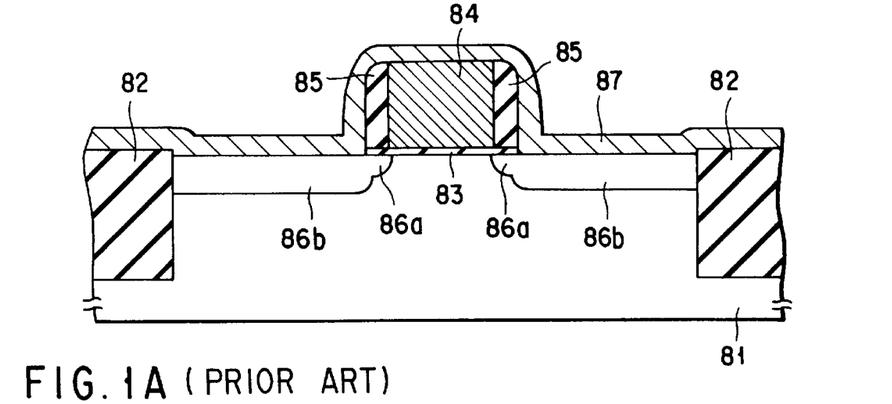
FIGS. 1A to 1C are cross sectional views showing a procedure of fabricating a MOS transistor of an LDD structure using a conventional salicidation process.
Figure 1B:
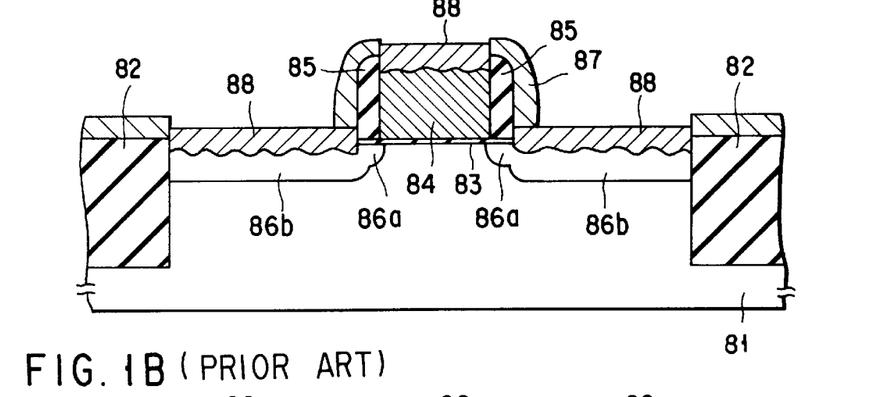
Figure 1C:
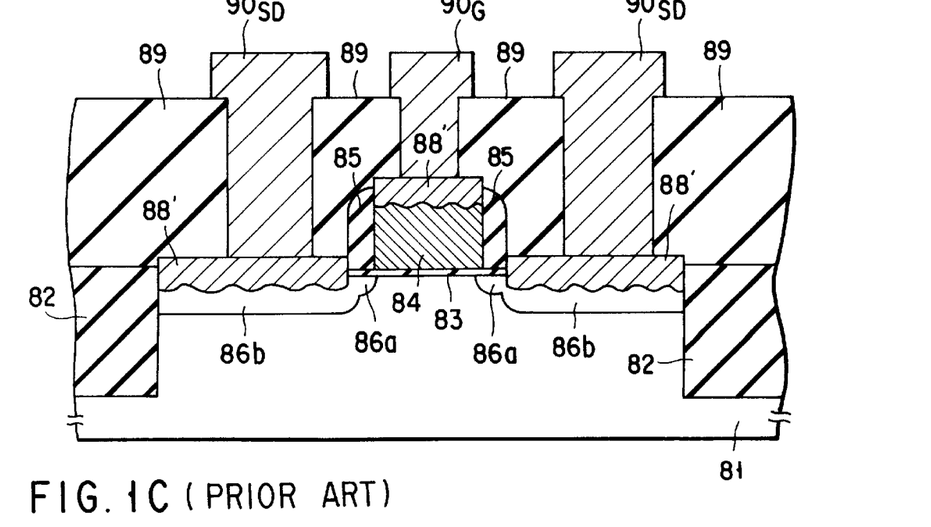

FIGS. 1A to 1C are cross-sectional views, explaining a method of manufacturing a MOS transistor of LDD (Lightly-Doped Drain) structure, which includes a salicidation process.

First, an element isolating insulation layer 82 in the upper surface of a silicon substrate 81, defining an element forming region in the surface of the substrate 81. A gate insulation film 83 and a gate electrode 84 made of polycrystalline silicon, are formed on the element forming region. Then, using the gate electrode 84 as a mask, impurity ions are implanted into the exposed surface of the substrate 81. The resultant structure is annealed, activating the impurity ions. A lightly-dosed source/drain diffusion (LDD) layer 86b is thereby formed in the surface of the substrate 81.

Next, gate side wall insulation layers 85 having a width of about 50 nm is formed on the sides of the gate electrode 84. Using the gate side wall insulation layers 85 and the gate electrode 84 as a mask, impurity ions are implanted into the exposed surface of the substrate 81. At the same time, impurity ions are implanted into polycrystalline silicon constituting the gage electrode 84. The resultant structure is annealed, activating the impurity ions. A highly-dosed source/drain diffusion layer 86b is thereby formed. The manufacturing steps thus far performed are identical to the steps of a method of manufacturing a MOS transistor of ordinary LDD structure.

Further, as shown in FIG. 1A, a cobalt (Co) film 87 about 20 to 30 nm thick is deposited on the entire surface of the substrate 81 by means of sputtering. The resultant structure is then subjected to lamp annealing in a nitrogen atmosphere at 500 to 600° C. for 30 to 60 seconds. The Co film 87 reacts with the silicon substrate 81 and also with the gate electrode 84 made of polycrystalline silicon. As a result, a cobalt silicide (CoSi) layer 88 is formed on the silicon substrate 81 and the gate electrode (polycrystalline silicon) 84 as is shown in FIG. 1B.

Unreacted part of the Co film 87 is removed by etching. The resultant structure is heated at 750 to 900° C. for 30 to 60 seconds. The CoSi layer 88 formed on the source/drain diffusion layer 86b and the CoSi layer 88 formed on the gate electrode 84 are thereby changed to $CoSi_2$ layers 88'.

An interlayer insulating layer 89 is formed on the entire surface of the substrate having the $CoSi_2$ layers 88' on it. Contact holes are made in the interlayer insulating layer 89, thereby exposing the $CoSi_2$ layers 88' which are formed on the source/drain diffusion layer 86b and the gate electrode 84, respectively.

Finally, source/drain electrode wires $90_{SD}$ and a gate electrode wire $90_G$ are formed, the former contacting the $CoSi_2$ layer 88' formed on the source/drain diffusion layer 86b, and the latter contacting the $CoSi_2$ layer 88' formed on the gate electrode 84. A MOS transistor is thus manufactured which has the LDD structure shown in FIG. 1C.

The $CoSi_2$ layer 88' formed on the source/drain diffusion layer 86a has a thickness of about 70 to 100 nm. This layer 88' has a low sheet resistance of 2 to 3 $\Omega/\square$. Nonetheless, the method of manufacturing a MOS transistor, which includes a salicidation process, has the following disadvantages.

The first disadvantage resides in the step of depositing the Co film 87 by sputtering. Since cobalt is magnetic material, the magnetic field generated by a magnet mounted on the cathode is confined in the Co target when the Co target is sputtered by means of commonly used magnetron sputtering. Hence, it is practically impossible to generate a magnetic field on the Co target to achieve densification of plasma. In the case of Ar plasma, no discharge will occur even if the Ar pressure is raised to 1.5 Pa or more.

To eliminate the first disadvantage, the thickness of the Co target may be reduced to 3 mm or less, making it possible to generate a magnetic field at a position remote from the surface of the Co target. If the thickness of the Co target is so reduced, however, the discharge current decreases to less than 1A. Consequently, stable sputtering can hardly be performed to form Co films.

Further, if the Co target is only 3 or less mm thick, it is used up quickly when sputtering is carried out. In this case, Co targets must be replaced, each with the next one, very frequently. This inevitably lowers the operating efficiency of the sputtering apparatus. Even if the Co target is made so thin, cobalt will be deposited on the peripheral jigs such as grounding seals surrounding the target and the cathode and will affect the control of the magnetic field of the cathode. In other words, the cobalt deposited changes the magnetic field generated over the surface of the Co target. As a result, the thickness and crystalline property of the Co film 87 formed on the silicon substrate 81 will deviate from the design values. When Co films are formed on two or more silicon substrates, the thickness and crystalline property of the Co film will deviate between substrates.

The second disadvantage resides in the roughness observed at the interface between the $CoSi_2$ layer 88' and the source/drain diffusion layer 86b. The roughness is as much as the thickness of the $CoSi_2$ layer 88' or is almost half the thickness of the layer 88'. Inevitably, the leakage current at the pn junction increases. Namely, it is difficult to form a $CoSi_2$ layer on a shallow source/drain diffusion layer 86b, which provides a flat interface between itself and the diffusion layer 86b. There appear to be two causes of the roughness. First, the $CoSi_2$ layer 88' consumes and extends into the source/drain diffusion layer 86b to a depth nearly equal to the thickness of the CoSi$_2$ layer 88'. Second, a contaminant (e.g., an oxide film naturally formed), if any, on the source/drain diffusion layer 86b results in unstable reaction between Co and Si.

The first cause may be eliminated by decreasing the thickness of the CoSi$_2$ layer 88'. If the layer 88' is made thinner, however, the surface area per volume of the layer 88' will increase. CoSi$_2$ tends to agglomerate to reduce the surface energy of the layer 88'. The first cause of the roughness cannot be eliminated by merely rendering the CoSi$_2$ layer 88' thinner.

The second cause may be removed by forming a thin titanium (Ti) film on the lower surface of the Co film 87. In this case, an intermediate film containing Ti, Si and Co is formed in the initial phase of reaction between the Co film 87 and the source/drain diffusion layer 86b. Co may then be applied to the diffusion layer 86b through the intermediate film, thereby to form a CoSi$_2$ layer which has a relatively uniform thickness. If the Ti film is too thin, however, the second cause cannot be eliminated. Conversely, if the Ti film is too thick, mixture of TiSi$_2$ and CoSi$_2$ is formed on the source/drain diffusion layer 86b. The mixture increases the sheet resistance of the layer 86b. An optimal value for the thickness of such a Ti film is reported to be about 5 to 10 nm. To form a Ti film having a thickness falling within this range, the process must be controlled with high accuracy. In view of this, it is not practical to use a Ti film to eliminate the second cause of the above-mentioned roughness.

BRIEF SUMMARY OF THE INVENTION

In view of the foregoing the present invention has been made. An object of the invention is to provide a sputtering target which effectively serves to form a conductive thin film composed mainly of a magnetic metal or a magnetic alloy.

Another object of the invention is to provide a method of manufacturing, with ease, a semiconductor device which comprises a substrate and a compound layer on its surface, the compound layer containing a component of the substrate and a metal and being one capable of forming a flat interface with the substrate.

According to the present invention, there is provided a sputtering target comprising: a main component having magnetic properties and consisting of a metal or an alloy; and a sub-component comprising at least one component selected from the group consisting of a nonmagnetic metal and a semiconductor.

According to this invention, there is provided a method of manufacturing a semiconductor device, comprising the steps of: forming a conductive thin film on a selectively exposed surface of a semiconductor substrate, the conductive thin film comprising a main component having magnetic properties and consisting of a metal or an alloy, and a sub-component comprising at least one component selected from the group consisting of a nonmagnetic metal and a semiconductor; and forming a compound layer on the selectively exposed surface of the semiconductor substrate by heating the semiconductor substrate, thereby causing a reaction between the substrate and the conductive thin film, the compound layer comprising the semiconductor forming the substrate and a metal component of the conductive thin film.

According to another aspect of the invention, there is provided a sputtering apparatus in which ions are impinged upon a sputtering target, causing the target to emit material, and the material is deposited on a semiconductor substrate, thereby to form a conductive thin film on the substrate. The sputtering target comprises a main component having magnetic properties and consisting of a metal or an alloy, and a sub-component comprising at least one component selected from the group consisting of a nonmagnetic metal and a semiconductor.

According to still another aspect of the present invention, there is provided a semiconductor device which comprises a semiconductor substrate and a compound layer formed on the substrate. The compound layer is made of compound which has been obtained by reacting a conductive thin film with the semiconductor substrate. The conductive thin film comprises a main component having magnetic properties and consisting of a metal or an alloy, and a sub-component comprising at least one component selected from the group consisting of a nonmagnetic metal and a semiconductor.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

A sputtering target according to the present invention contains a main component having magnetic properties and consisting of a metal or alloy and a sub-component having no magnetic properties. The sub-component may be at least one component selected from the group consisting of non magnetic metal and a semiconductor.

The sputtering target of the present invention including the sub-component is lower in the magnetic permeability than any conventional sputtering target made of material having magnetic properties and consisting of a metal or alloy. As the magnetic field confined in the sputtering target is minimized, the intensity of the magnetic field formed over the surface of the sputtering target is increased.

Using the sputtering target which is easily sputtered, a conductive thin film including the main component and the sub-component can be deposited on the desired surface.

The sputtering target of the present invention allows the magnetic field to be formed outside the sputtering target surface and is not required for having its thickness decreased. As a result, the disadvantages accompanied with the conventional target are not caused. More specifically, prevented is such an event that the frequency of replacing the sputtering target with a new one is increased thus to lower the efficiency of apparatus operation.

The presence of the sub-component in the target decreases a margin of the main component having magnetic properties which is deposited on the peripheral jigs such as grounding seals mounted about the sputtering target, hence decreasing a change in the magnetic field over the surface of the sputtering target. This minimizes nonuniformity of the thickness and the crystalline property of the deposited film in the semiconductor substrate and between the semiconductor substrates.

We, the inventors, found that the method of the present invention promotes formation of a compound layer having a highly planer interface on a semiconductor substrate. The method starts with forming on the semiconductor substrate a conductive thin film which comprises a main component having magnetic properties made of a metal or alloy and a sub-component made of at least one of non magnetic metal and a semiconductor. The semiconductor substrate having the conductive thin film thereon is subjected to heat treatment for causing a reaction between the semiconductor substrate and the conductive thin film to form a compound layer containing a semiconductor constituting the semiconductor substrate and a metal component in the conductive thin film. Accordingly, the method of the present invention is proved to have a highly planer interface between the compound layer and the semiconductor substrate.

Eventually, using the method of the present invention, it is possible to fabricate a semiconductor device in which a compound layer formed on a semiconductor substrate is highly planer at the interface between the compound layer and the semiconductor substrate.

Particularly, in case that the conductive thin film includes Ti, Zr, Hf, V, Nb, Ta, or Cr as the sub-component, a natural oxide film on the semiconductor substrate is reduced by the action of the sub-component. This provides uniformity of the reaction between the semiconductor constituting the substrate and the metal component in the conductive thin film thus producing a highly planer interface.

In case of the conductive thin film including Sn, Pb, Si, or Ge as the sub-component, the consumption of the semiconductor substrate is attenuated during formation of the compound layer. This generates a highly planer interface between the compound layer and the semiconductor substrate.

In fabricating, for example, a MOS transistor with the method of the present invention, the interface between a source/drain diffusion layer on the substrate and a silicide layer on the diffusion layer is made highly planer. Accordingly, the silicide layer can be formed on the shallow source/drain diffusion layer without increasing the pn junction leakage.

The present invention will be described in more detail referring to the accompanying drawings.

Embodiment 1

This embodiment describes an example in which the sputtering target is a CoSi alloy comprising Co as the main component and Si as the sub-component.

First, CoSi alloy films were deposited using CoSi alloy targets of different Si concentration, and the relation between the Si concentration in each CoSi alloy target and the growth rate of the CoSi alloy film was examined. Its resultant profile is shown in FIG. 2.

Figure 2:
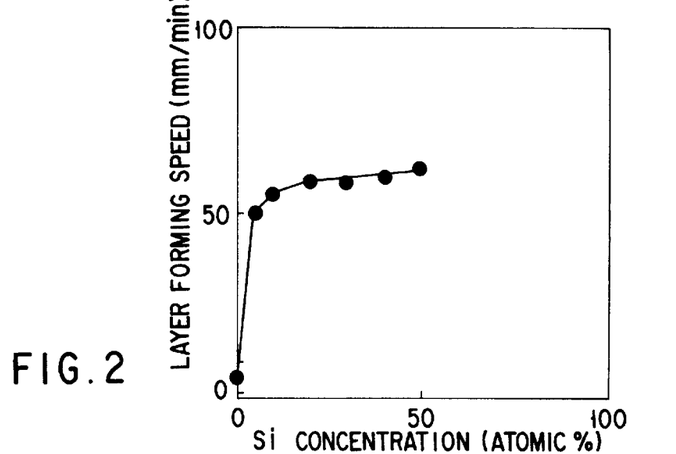
FIG. 2 is a characteristic diagram showing the relation between the Si concentration in a CoSi alloy target and the film growth rate.

It is apparent from FIG. 2 that as the Si concentration is increased, the film growth rate is also increased. For example, the film growth rate with a target of which Si concentration is substantially 5 atomic % is about 50 nm/min. This is almost 10 times faster then the film growth rate with a pure Co target (Si concentration=0 atomic %).

The reason why the film growth rate is increased as the Si concentration in the CoSi alloy target soars is explained below.

When the Si concentration is high, the magnetic permeability in the CoSi alloy target becomes low thus increasing the intensity of a magnetic field formed outside the target. As the intensity of the magnetic field is increased, the density of plasma over the target surface increases hence enhancing the sputtering effect. Accordingly, as the Si concentration increases, the sputtering effect is improved thus increasing the growth rate of the CoSi alloy film.

With the target of this embodiment, the magnetic field is formed outside the surface of the Co-based target. There is hence no need of decreasing the thickness of the target. This eliminates such a disadvantage that the target has to be replaced with a new one at higher frequency in mass production causing the operational efficiency of the system to be declined.

When the target of this embodiment is used, increasing the pressure in the system is unnecessary for enhancement of the sputtering effect. Accordingly, such a disadvantage is eliminated that sputtering gas, e.g. Ar, and remaining gas, e.g. $CO_2$, $H_2O$, or $O_2$, are trapped in the CoSi alloy film.

Also, since Si in the target is contained as the sub-component, the deposition of Co on the peripheral jigs such as grounding seals about the target is decreased by a margin of the sub-component. This attenuates changes in the magnetic field over the surface of the target and minimizes nonuniformity of the film quality such as thickness and the crystalline property of the deposited CoSi alloy film in a single semiconductor substrate. Equally, nonuniformity of the film quality of the deposited CoSi alloy films between two or more semiconductor substrates will be minimized.

Figure 3:
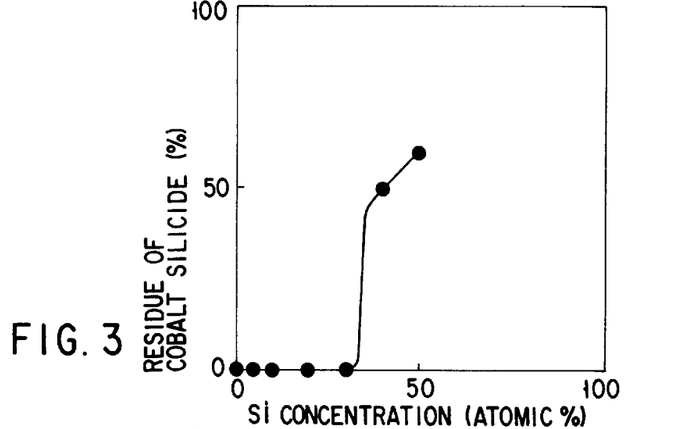
FIG. 3 is a characteristic diagram showing the relation between the Si concentration in a CoSi alloy target and the amount of the residue of cobalt silicide.

FIG. 3 illustrates a resultant profile representing the relation between the Si concentration in a CoSi alloy target and the amount of the etching residue of Co silicide.

When a higher amount of Si is contained, the Si content in the sputtered film (CoSi alloy film) increases and the Co content decreases. It was however proved as shown in FIG. 3 that when the Si concentration is 33 atomic % or more, the amount of the etching residue of Co silicide is sharply increased.

The increase of the etching residue of Co silicide results in the following event. When the CoSi alloy film having a higher rate of the Si concentration has been deposited on the insulating layer such as an $SiO_2$ layer, it is hardly etched using a Co etching solution (a mixture of sulfuric acid solution and hydrogen peroxide solution or a mixture of hydrochloric acid solution, hydrogen peroxide solution, and water).

When the CoSi alloy film is deposited on the insulating layer and the Si exposed region of the semiconductor substrate using the sputtering method with a CoSi alloy target containing Si in a concentration of less than 33 atomic %, resultant CoSi alloy film includes a higher amount of Co than $Co_2Si$ which is a compound phase containing maximum amounts of Co.

As the CoSi alloy film on the semiconductor substrate has been subjected to heat treatment (at 500 to 600° C. for 30 to 60 seconds), most of Co in the CoSi alloy film on the insulating layer is not converted to a silicide phase. On the other hand, a CoSi layer is selectively formed on the Si exposed region.

Meanwhile, the CoSi alloy film deposited on the insulating layer and Si exposed regions of the semiconductor substrate by the sputtering method of the CoSi alloy target of which Si concentration is 33 atomic % or more has a higher Si concentration than that of $Co_2Si$.

When the CoSi alloy film on the semiconductor substrate has been heat treated, a CoSi layer is formed on the Si exposed region and all amounts of Co in the CoSi alloy film on the insulating layer are converted to a silicide phase.

Therefore, the CoSi alloy film on the insulating layer will hardly be dissolved by the Co etching solution failing to selectively form a CoSi layer on the Si exposed region.

It is thus desired for forming a Co silicide layer on only the Si exposed region of the substrate by the sputtering method with a CoSi alloy target to have the Si concentration in the CoSi alloy target of less than 33 atomic %. Also, the Si concentration in the CoSi alloy target is preferably not less than 2.5 atomic % to obtain the effect of Si.

The CoSi alloy target according to the present invention further has following advantage.

The CoSi alloy film deposited by the sputtering method with the CoSi alloy target contains a given amount of Si which participates the formation of silicide. More particularly, as a silicide layer is formed on the silicon substrate, the consumption of silicon in the substrate used for the reaction will be minimized.

Figure 4:
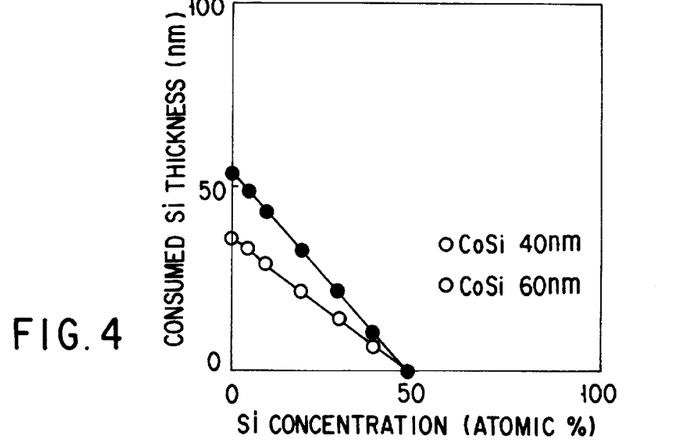
FIG. 4 is a characteristic diagram showing the relation between the Si concentration in a CoSi alloy target and the thickness of Si layer which is consumed during the formation of CoSi.

FIG. 4 illustrates a resultant profile of the relation between the Si concentration in the CoSi alloy target and the thickness of a Si region consumed during the formation of CoSi.

The profile represents the thickness of a surface region of the silicon layer consumed when the CoSi layer having a thickness of 40 nm and the CoSi layer having a thickness of 60 nm are respectively formed on the silicon layer.

As apparent from FIG. 4, the thickness of the consumed surface region (the thickness of Si consumed) in the silicon layer is 54 nm when the CoSi layer of 60 nm thick is formed using a pure Co target containing no Si.

When the CoSi layer of 60 nm thick is formed using a CoSi alloy target with 10 atomic % of the Si concentration, the thickness of Si consumption is reduced to 43 nm. Using a CoSi alloy target with 20 atomic % of the Si concentration, the thickness of Si consumption is as low as 33 nm and with 30 atomic %, as 22 nm. It is understood that the higher the Si concentration in the CoSi alloy target, the smaller the thickness of Si consumption becomes.

Similarly, in forming the CoSi layer of 40 nm thick, the higher the Si concentration in the CoSi alloy target, the smaller the thickness of Si consumption becomes.

According to this embodiment, the CoSi alloy target is used as a sputtering target comprising mainly of Co so that the thickness of Si consumption is minimized. Consequently, a desired Co silicide layer can be formed on the shallow pn junction without increasing the pn junction leakage.

When the Si concentration in the CoSi alloy target is less than 33 atomic %, Co silicide layer can be formed with high selectivity. Preferably, the Si concentration is less than 30 atomic % in view of margin.

Embodiment 2

This embodiment describes an example in which the sputtering target is a CoTi alloy target comprising Co as the main component and Ti as the sub-component.

Using the CoTi alloy targets of different Ti concentrations, CoTi alloy films were deposited, and the relation between the Ti concentration in each CoTi alloy target and the growth rate of a CoTi alloy film was examined. A resultant profile of the examination is shown in FIG. 5.

Figure 5:
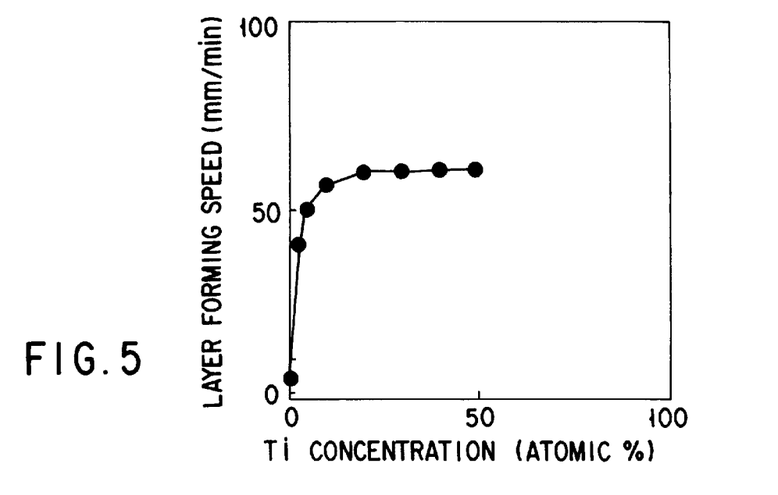
FIG. 5 is a characteristic diagram showing the relation between the Ti concentration in a CoTi alloy target and the film growth rate.

As apparent from FIG. 5, the growth rate is sharply increased when the CoTi alloy target is used like the CoSi alloy target of Embodiment 1.

When, for example, the CoTi alloy target having 2.5 atomic % of the Ti concentration is used, the growth rate is about 40 nm/min. The growth rate is almost eight times greater than that with a non-Ti-contained Co target (a pure Co target). When the Ti concentration in the CoTi alloy target is 5 atomic %, the growth rate is almost ten times greater than that with the pure Co target. It is thus understood that the sputtering speed is improved when Ti is added as the sub-component to Co constituting the main component similar to the case of Si is added.

Figure 6:
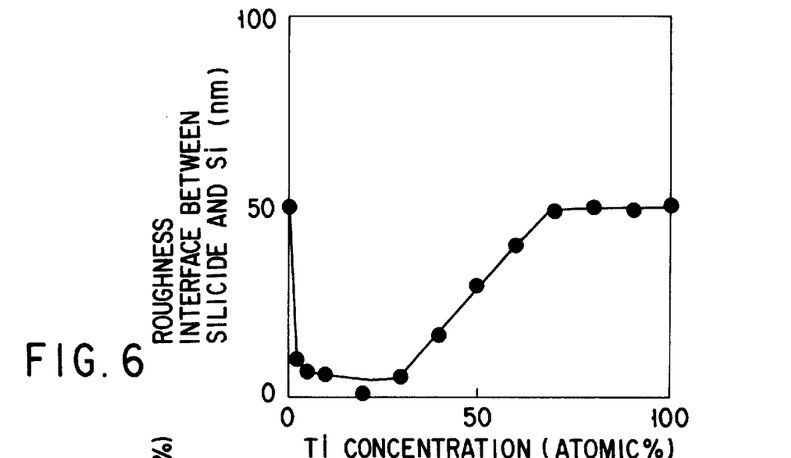
FIG. 6 is a characteristic diagram showing the relation between the Ti concentration and the magnitude of roughness on silicide/Si interface.

FIG. 6 shows the relation between the Ti concentration in the sputtering target and the magnitude of roughness on the silicide/Si substrate interface.

The evaluation is as follows. An oxide layer was formed on a silicon substrate and removed desired regions to expose the silicon substrate. Using the sputtering method with a CoTi alloy target, a CoTi alloy film having a thickness of 30 nm was deposited on the silicon substrate. After the silicon substrate having the CoTi alloy film thereon was heated at 600 to 700° C. for 30 seconds in the vacuum or nitrogen atmosphere, unreacted portions of the CoTi alloy film were removed. Then, the silicon substrate was heated at 800 to 850° C. for 30 seconds to form a silicide ($CoSi_2$ or $TiSi_2$) layer. The roughness on the interface between silicide ($COSi_2$ or $TiSi_2$ layer) and Si (silicon substrate) was measured by cross section TEM (transmission electron microscope).

The measurement at 0 atomic % of the Ti concentration is based on a Co layer replacing the CoTi layer and at 100 atomic % is based on a Ti layer.

As apparent from FIG. 6, the magnitude of roughness on the interface between silicide and silicon substrate is less than 10 nm when the target having 2.5 to 33 atomic % of the Ti concentration is used. Accordingly, the Ti concentration is preferably not less than 2.5 atomic % and less than 33 atomic %.

With the pure Co target, a Co film is deposited on the silicon substrate and Co nucleate nonuniformly to form $CoSi_2$. Accordingly, the thickness of silicide layer is varied between where nucleation is first made and where disilicide is finally made. This causes the roughness of substantially 50 nm to be occurred on the interface between the silicon substrate and the silicide layer.

As the Ti concentration is increased, there is produced a region where the concentration of Co is locally high. With 100 atomic % of the Ti concentration like 0 atomic %, the roughness on the interface is increased.

This results from agglomeration due to fast diffusion of Si and declination of the surface energy at the $TiSi_2$/Si interface.

It is thus desired to allow the Ti concentration in the CoTi alloy target not excessively high. Specifically, the Ti concentration in the CoTi alloy target is less than 33 atomic % for providing silicide excellent in uniformity. Preferably, the Ti concentration is less than 30 atomic % in view of margin.

According to this embodiment, the CoTi alloy target comprising mainly of Co is used as a sputtering target so that the growth rate of a resultant CoTi alloy film is increased.

When the Ti concentration in the CoTi alloy target is less than 33 atomic %, the interface between the silicide layer formed by heat treatment and the silicon substrate is highly planer. Since there is no need of decreasing the thickness of the sputtering target similar to Embodiment 1, the efficiency of system operation will never be declined. Also, using the target of Embodiment 2, nonuniformity of the thickness and the quality of formed layer in a substrate or between the plural substrates will be avoided.

Figure 7:
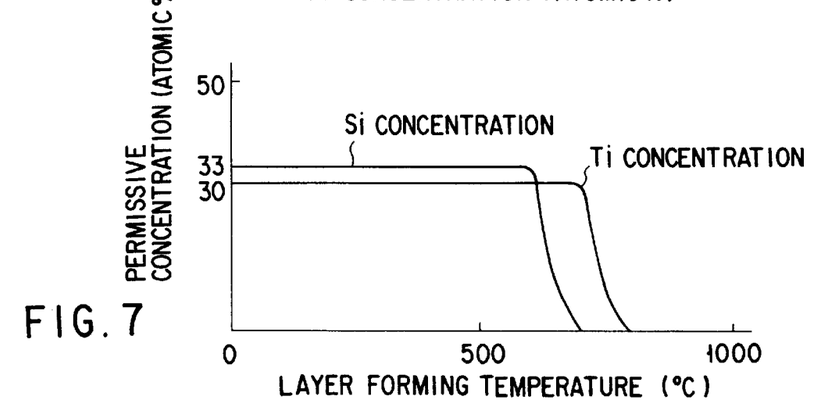
FIG. 7 is a characteristic diagram showing the relation between the silicide forming temperature and the permissive concentration (of Si and Ti).

FIG. 7 illustrates the relation between the temperature (°C.) for formation of silicide and the permissive concentration (atomic %) of sub-component (Si, Ti). It is apparent that the permissive concentration is sharply decreased when the temperature exceeds to a critical degree.

The cause of decrease of the permissive concentration of Si and Ti may be explained from the following fact, respectively. In case of Si, as the formation temperature is increased a more amount of the etching residue is remained. In case of Ti, increase of the formation temperature causes a greater magnitude of the surface roughness. It is hence desired to keep the temperature for formation of silicide lower than the critical degree. Preferably, the temperature for heat treatment is not more than 650° C. in case of Si added and not more than 750° C. in case of Ti is added.

Embodiment 3

FIGS. 8A to 8F are cross sectional views showing a procedure of fabricating a MOS transistor according to a third embodiment of the present invention.

The embodiment allows a CoTi alloy film to be deposited and reacted for forming self-aligned fashion Ti silicide layer on the source/drain diffusion layer and the gate electrode.

Figure 8A:
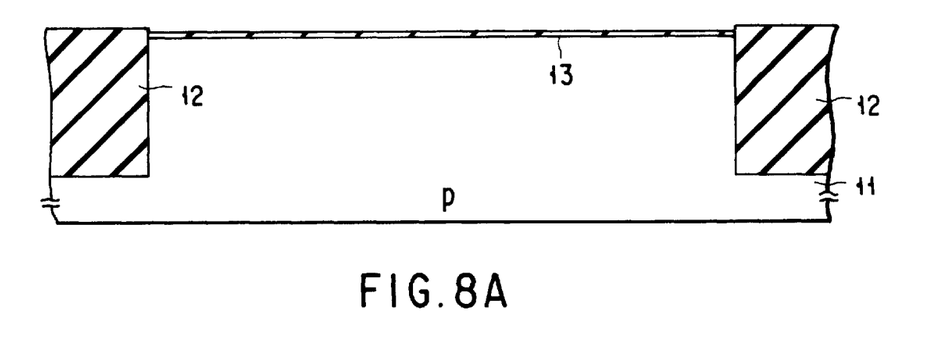
FIGS. 8A to 8F are cross sectional views showing a procedure of fabricating a MOS transistor according to a third embodiment of the present invention.

The procedure starts with forming grooves in a p-type silicon substrate 11 and filling the grooves to form element isolating insulation layers 12. An element forming regions between the two element isolating insulation layers 12 thus formed is defined on the surface of the semiconductor substrate. The element isolating insulation layer 12 may be constitute with silicon oxide layer. Then, a gate insulation layer 13 is formed on the substrate and a structure shown in FIG. 8A is completed.

As shown, the upper surface of the element isolating insulation layer 12 is higher than the surface of the substrate 11. The upper surface of the element isolating insulation layer 12 may be flush with the upper surface of the substrate 11.

Figure 8B:
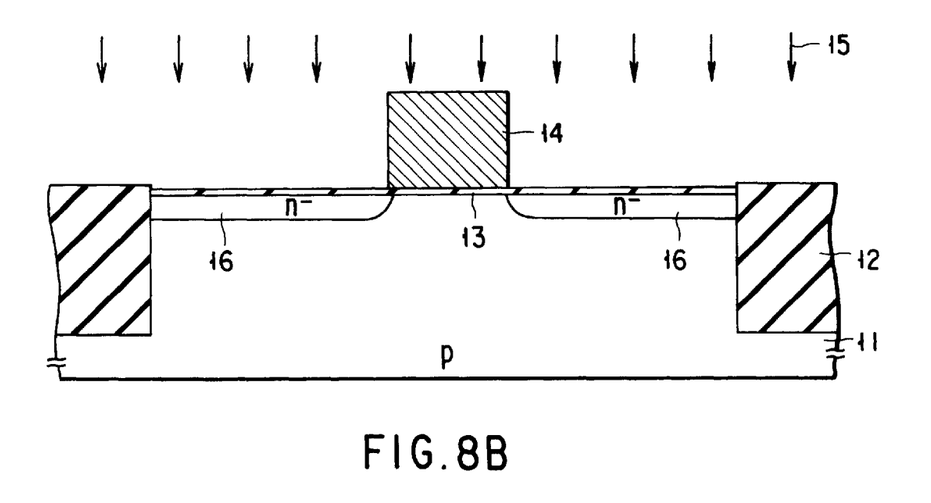

This is followed by forming a gate electrode 14 made of polysilicon on the gate insulation layer 13. Using the gate electrode 14 as a mask, n-type impurity ions 15 such as phosphorus ions are implanted into a surface region of the substrate to form a lightly-doped shallow n-type diffusion (LDD) layer 16.

Then, an insulation layer which is turned to gate side wall insulation layers 17 is deposited to a thickness enough to cover the gate electrode 14 entirely, and its unwanted regions are etched away by anisotropic etching such as reactive ion etching. As the result, a portion of the insulation layer is remained on the side surface of the gate electrode 14, thereby forming the gate side wall insulation layer 17 having a width of about 50 nm on the side wall of the gate electrode 14, as shown in FIG. 8C.

Figure 8C:
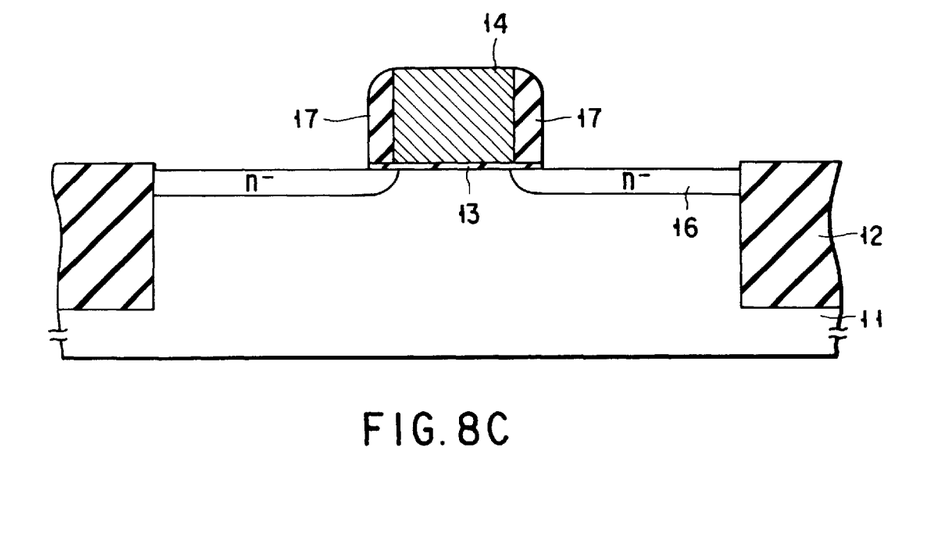

Simultaneously, exposed portions of the gate insulation layer 13 except beneath the gate electrode 14 are removed thus obtaining a structure shown in FIG. 8C.

Figure 8D:
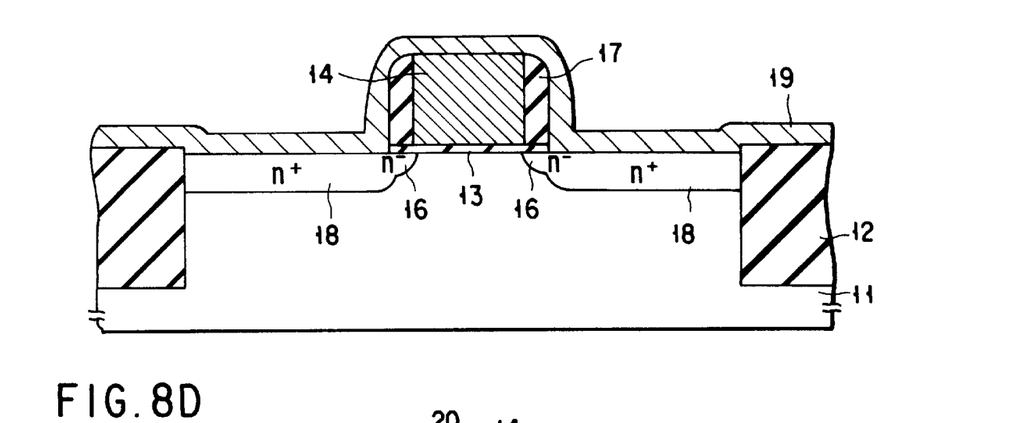

Using the gate electrode 14 and the gate side wall insulation layer 17 as masks, the n-type impurity ions such as phosphorus ions are implanted again into the surface of the substrate hence forming a highly-doped n-type source/drain diffusion layer 18. The substrate 11 with the gate electrode 14 is completely covered with a cobalt (Co) film 19 containing Ti in the thickness of 30 nm. The thickness of the cobalt (Co) film 19 containing Ti may preferably be determined so that a resultant disilicide layer finally formed is not more than 100 nm. This reason is described as following. The thickness of the consumed Si layer is about 3.5 times of that of the Co film. As a result, $CoSi_2$ layer is formed so as to embedded therein. Since the value of the sheet resistance is required not more than 20 $\Omega/\square$, the thickness of the silicide film finally formed is more preferably 15 nm or more.

For forming the Co layer 19 including Ti, a sputtering apparatus equipped with a CoTi alloy target of which Ti concentration is 10 atomic % is used.

Figure 8E:
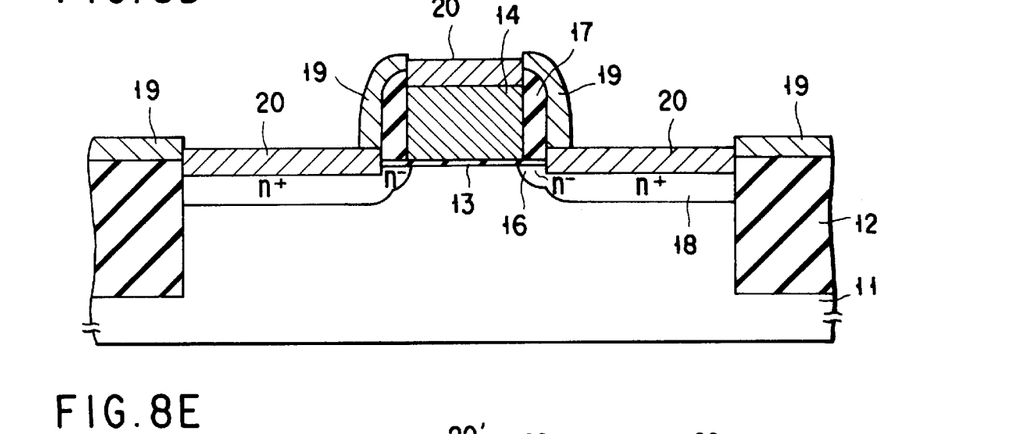

This is followed by a first process of rapid thermal annealing (RTA) with lamp anneal at 500 to 600° C. for 30 to 60 seconds in the atmosphere of nitrogen. Accordingly, cobalt silicide (CoSi) layer 20 having a thickness of 55 nm are formed in self-aligned fashion on the gate electrode 14 and the n-type source/drain diffusion layer 18, as shown in FIG. 8E.

In the first step of the silicide forming process, the n-type source/drain diffusion layer 18 made substantially of silicon is reduced by a portion of Ti contained in the Co film 19. Equally, the natural oxide layer on the gate electrode 14 is reduced by Ti. This causes a uniform reaction between the silicon layer and the Co film 19. Hence, the interface between the silicon layer and the CoSi layer 20 will highly be planer.

Since most of Ti is diffused to a surface region of the CoSi layer 20, a TiN layer (not shown) is formed to a thickness of about 2 to 3 nm on the CoSi layer 20. The TiN layer has a function of suppressing the roughness on the surface of the CoSi layer 20, thus improving further the planer interface between the silicon layer and the CoSi layer 20.

Figure 9A:
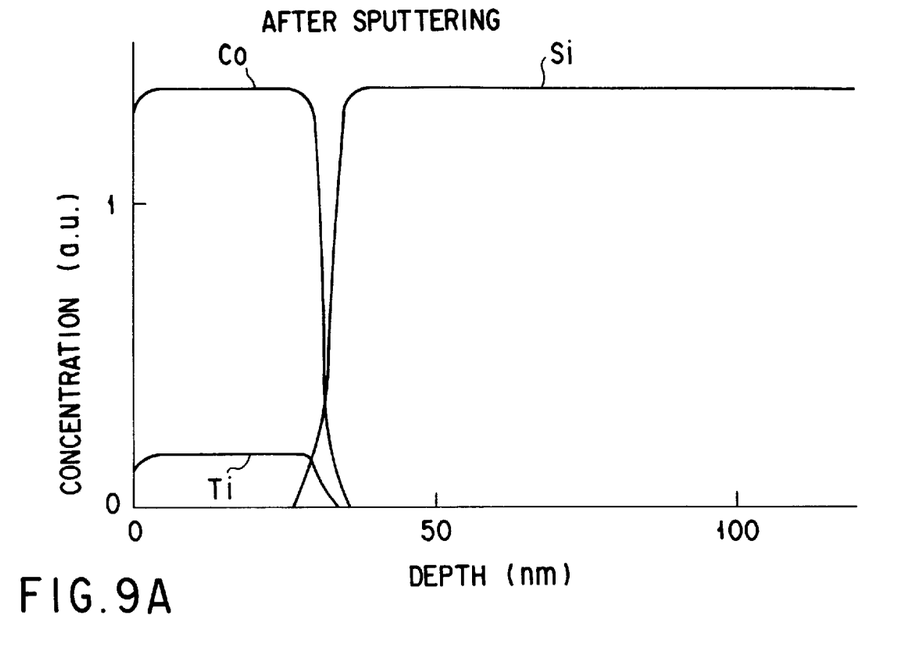
FIGS. 9A and 9B are diagrams showing the diffusion of Ti into the surface region of a CoSi layer by heat treatment.
Figure 9B:
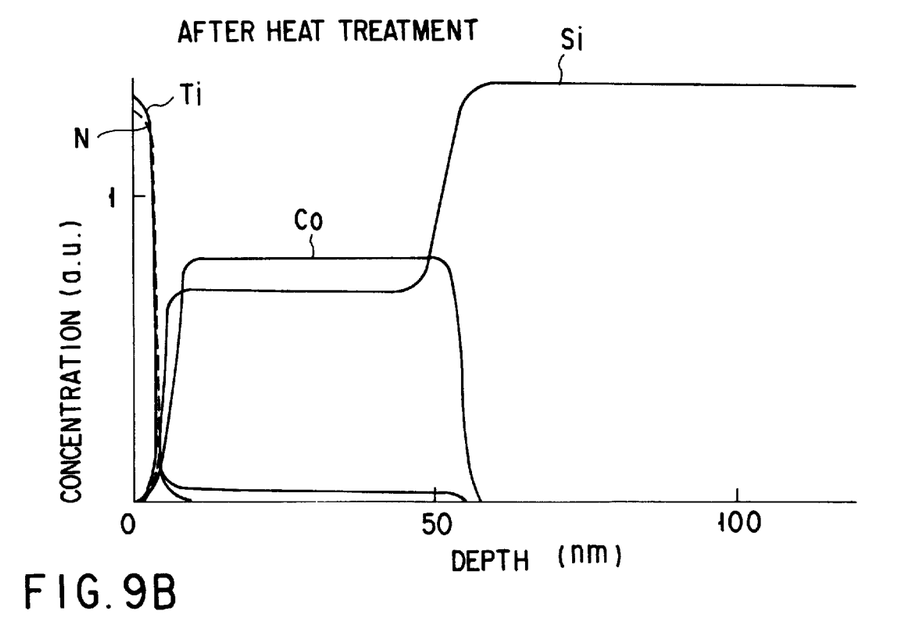

FIGS. 9A and 9B are graph diagrams showing the diffusion of Ti into the CoSi layer 20 by the first heat treatment (at 550° C. for 60 seconds). As shown in FIG. 9A, Ti is uniformly diffused in the Co film 19 just after the sputtering. It is apparent from FIG. 9B that when the first heat treatment has been carried out, the CoSi layer 20 is formed in which Ti is rather concentrated in its surface region. The reason why the TiN layer is progressively formed is that nitrization of Ti decreases the standard free energy of Gibbs by about 50 kcal/mol.

This phenomenon is not limited to Ti but may also occur when, for example, Zr or Hf is used as the sub-component.

Figure 10A:
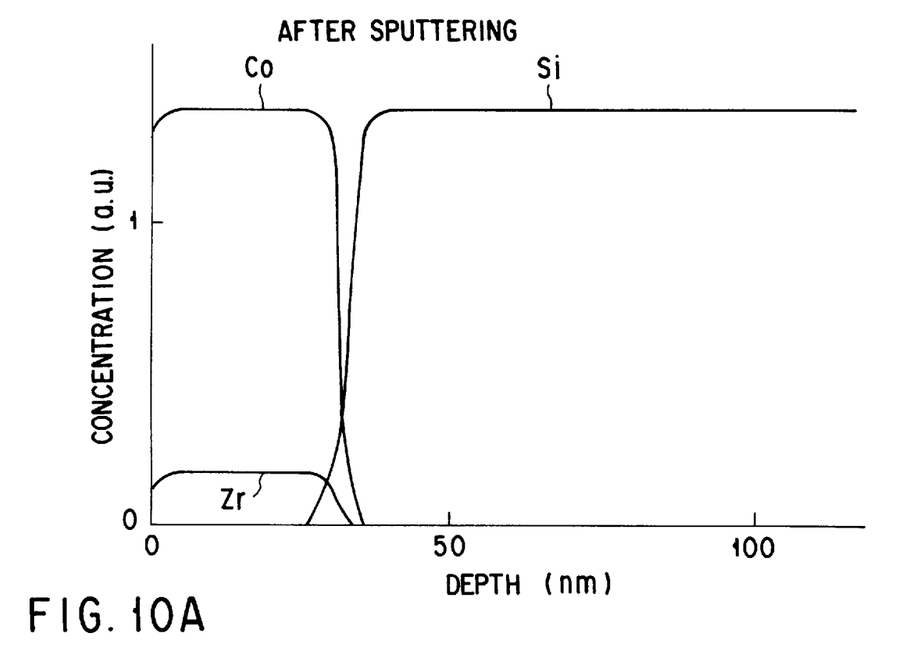
FIGS. 10A and 10B are diagrams showing the diffusion of Zr into the surface region of a CoSi layer by heat treatment.
Figure 10B:
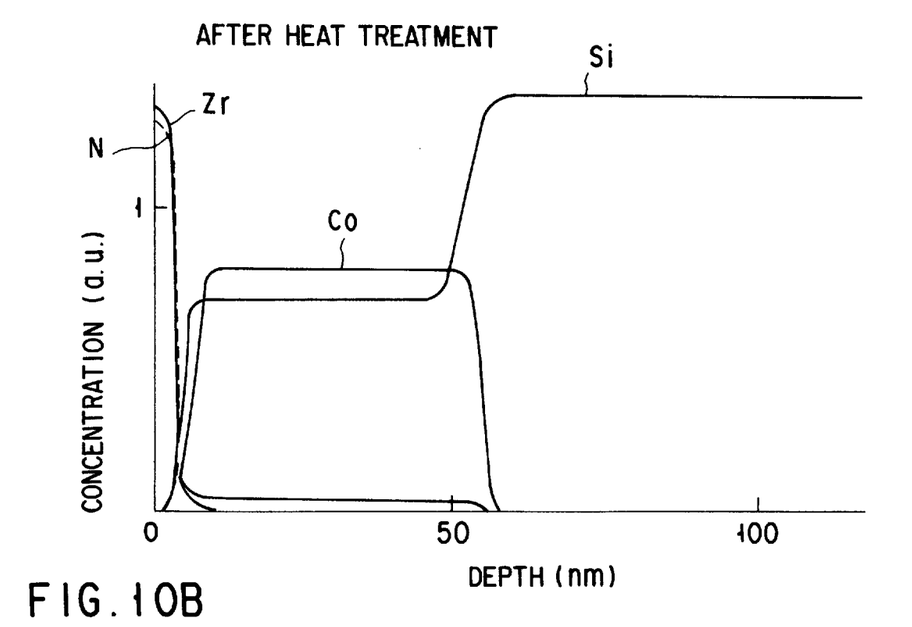
Figure 11A:
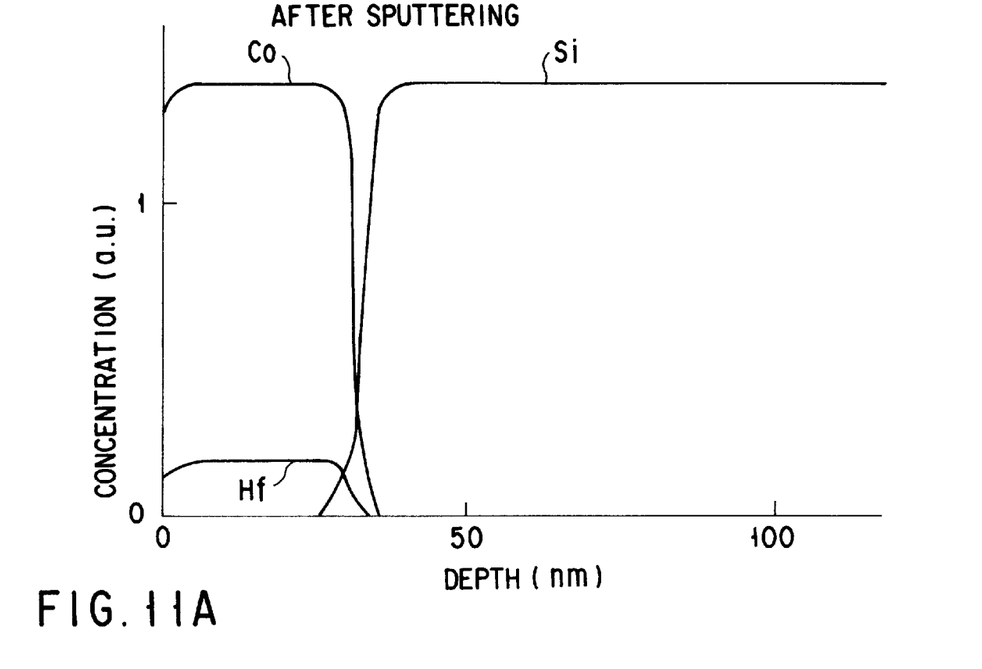
FIGS. 11A and 11B are diagrams showing the diffusion of Hf into the surface region of a CoSi layer by heat treatment.
Figure 11B:
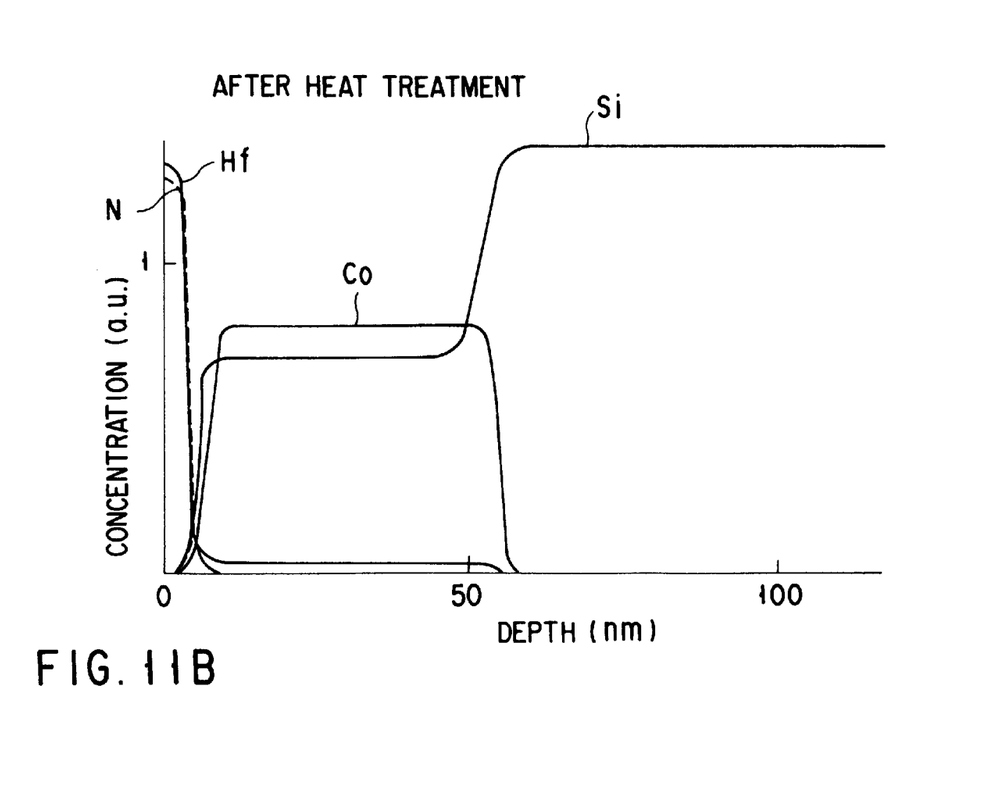

FIGS. 10A and 10B are graph diagrams showing the diffusion of Zr into the CoSi layer 20 by the first heat treatment (at 550° C. for 60 seconds). Similarly, FIGS. 11A and 11B are graph diagrams showing the diffusion of Hf into the CoSi layer 20 by the first heat treatment (at 550° C. for 60 seconds). In both FIGS. 10 and 11, the concentration of the sub-component is respectively 10 atomic %.

Zr and Hf like Ti are successfully diffused by the heat treatment as shown in FIGS. 10A, 10B, 11A, and 11B.

After the first heat treatment, unwanted portions of the TiN layer (not shown), the unreacted Co film 19 on the insulation layer 12, and the unreacted Co film 19 on the insulation layer 17 are removed by etching. The etching is performed using a Co etching solution (a mixture of sulfuric acid solution and hydrogen peroxide solution or a mixture of hydrochloric acid solution, hydrogen peroxide solution, and water).

Figure 8F:
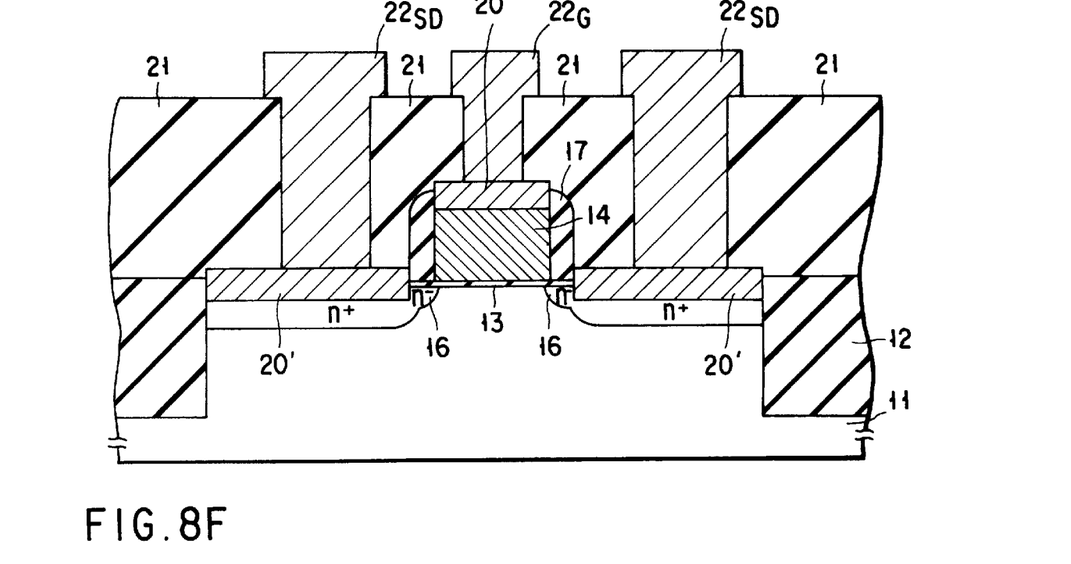

Then, the second step of the silicide forming process follows. The second step starts with subjecting the above processed semiconductor substrate to a second process of RTA at 800 to 900° C. for 30 to 60 seconds. Accordingly, the CoSi layer 20 having a thickness of 55 nm formed on the gate electrode 14 is converted to a $CoSi_2$ layer 20' having a thickness of 88 nm while the CoSi layer 20 having a thickness of 55 nm formed on the n-type source/drain diffusion layer 18 is also converted to a $CoSi_2$ layer 20' having a thickness of 88 nm.

It was found that the sheet resistance of the $CoSi_2$ layer 20' is as low as 1.7 Ω/□. Also, the magnitude of roughness on the interface between the n-type source/drain diffusion layer 18 and the $CoSi_2$ layer 20' is decreased to 5 nm or less. While the magnitude of roughness in the prior art is substantially 50 nm, it is remarkably decreased by the method of the present invention. 5 nm of the magnitude of roughness may create no adverse effect.

Then, the substrate having the $CoSi_2$ layer 20' thereon is entirely coated with an interlayer insulation layer 21 and predetermined portions of the interlayer insulation layer 21 is removed by etching to form contact holes on the $CoSi_2$ layer 20'.

Finally, source/drain wires $22_{SD}$ and a gate wire $22_G$ are patterned to connect across the contact holes to the $CoSi_2$ layer 20', completing such a structure of the MOS transistor as shown in FIG. 8F.

According to this embodiment, the formation of the $CoSi_2$ layer 20' over the silicon substrate starts with depositing the Co film 19 including Ti with a sputtering apparatus equipped with the CoTi alloy target of which Ti concentration is 10 atomic %. Then, the $CoSi_2$ layer 20' is formed on the n-type source/drain diffusion layer 18 by the heat treatment.

This allows the interface between the n-type source/drain diffusion layer 18 and the $CoSi_2$ layer 20' to be highly planer due to the reduction of Ti contained in the target. Accordingly, even if the n-type source/drain diffusion layer 18 is made shallow, current leakage from the pn junction will hardly be occurred in this embodiment.

Embodiment 4

FIGS. 12A to 12F are cross sectional views showing a procedure of fabricating a MOS transistor according to Embodiment 4 of the present invention.

This embodiment allows a CoSi alloy film to be deposited and reacted for forming self-aligned fashion Co silicide layer on the source/drain diffusion layer.

While the previous Embodiment 3 provides the Co silicide layer on both the gate electrode and the source/drain diffusion layer, this embodiment permits the Co silicide layer to be formed in self-aligned fashion on only the source/drain diffusion layer.

The procedure starts with forming grooves in a p-type silicon substrate 31 and filling the grooves to form element isolating insulation layers 32. An element forming region between the two element isolating insulation layers is defined on the surface of the semiconductor substrate. The element isolating insulation layer 32 may be constitute with silicon oxide. Then, a gate insulation layer 33 is formed on the surface of the substrate to obtain a structure shown in FIG. 12A.

Figure 12A:
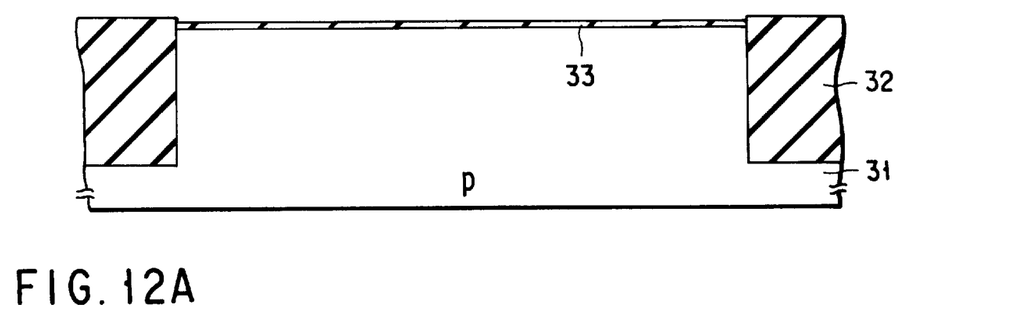
FIGS. 12A to 12F are cross sectional views showing a procedure of fabricating a MOS transistor according to a fourth embodiment of the present invention.

Although the upper surface of the element isolating insulation layer 32 is higher than the surface of the substrate 31 in the example shown in FIG. 12A, it may be flush with the same.

Figure 12B:
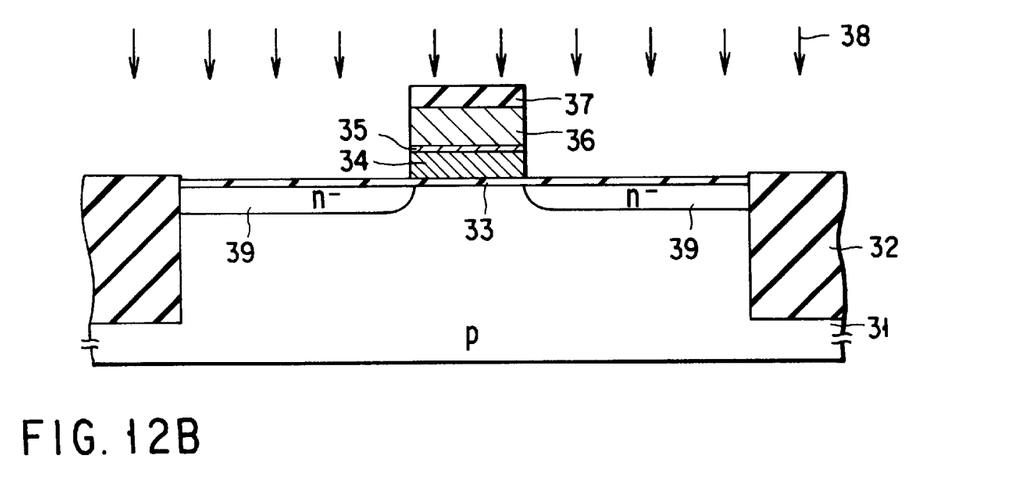

This is followed by depositing in a sequence a polysilicon layer 34 having a thickness of 50 nm, a tungsten silicon nitride (WSiN) layer 35 having a thickness of 1 nm, and a tungsten layer 36 having a thickness of 100 nm over the gate insulation layer 33 to form a gate electrode (polymetal) of a multi-layer structure. Then, a silicon nitride ($Si_3N_4$) layer 37 is provided on the tungsten layer 36. While the silicon nitride layer 37 and the gate electrode are used as masks, ions of n-type impurity material 38 such as phosphorus ions are implanted into a surface region of the substrate to form a lightly-doped shallow n-type diffusion (LDD) layer 39 as shown in FIG. 12B.

The entire of the gate electrode (comprising the polysilicon layer 34, the tungsten silicon nitride layer 35, the tungsten layer 36, and the silicon nitride layer 37) is covered with an insulation layer having an enough thickness which is turned to a gate side wall insulation layer 40. Unwanted portions of the insulation layer are etched away by a known anisotropic etching technique such as reactive ion etching. Accordingly, a portion of the insulation layer is remained on the side surface of the gate electrode, thereby obtaining the gate side wall insulation layer 40 having a width of about 50 nm on the side wall of the gate electrode as shown in FIG. 12C.

Figure 12C:
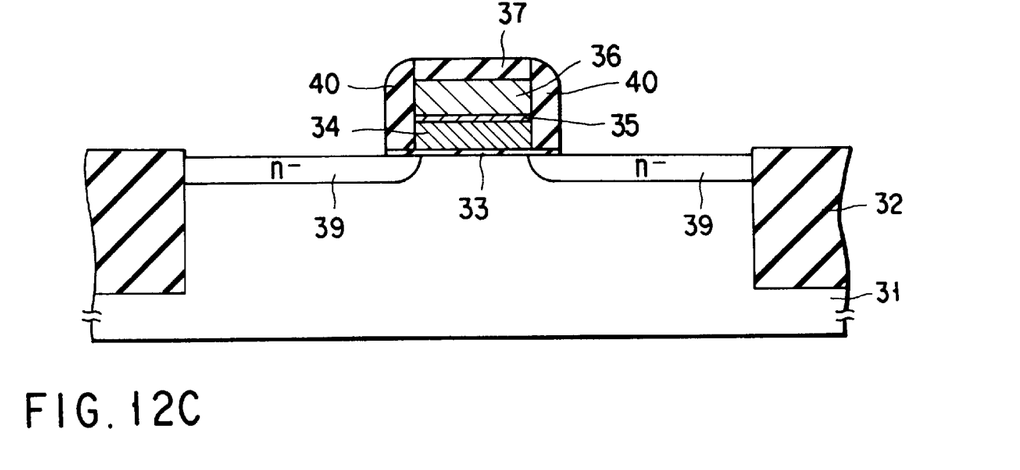

Simultaneously, the gate insulation layer 33 which has been exposed also is removed except a region beneath the gate electrode, and such a resultant structure is completed as shown in FIG. 12C.

Figure 12D:
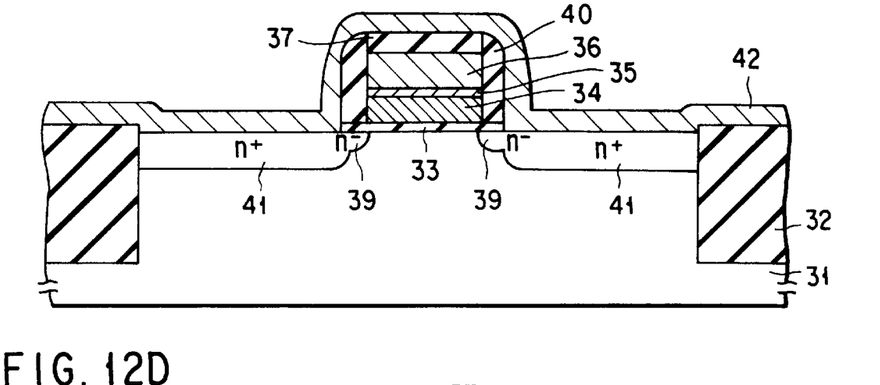

With the gate electrode and the gate side wall insulation layer 40 using as a mask, ions of the n-type impurity such as phosphorus are implanted into the surface of the substrate to form a highly-doped n-type source/drain diffusion layer 41. Then, the entirety of the substrate with the gate electrode is covered with a cobalt (Co) film 42 containing Si in the thickness of 15 nm. The thickness of the Co film 42 including Si is preferably determined so that a resultant disilicide layer has a thickness in a range of about 15 nm to 100 nm.

The Co film 42 including Si is formed with a sputtering apparatus equipped with the CoSi alloy target of which Si concentration is 10 atomic %.

Figure 12E:
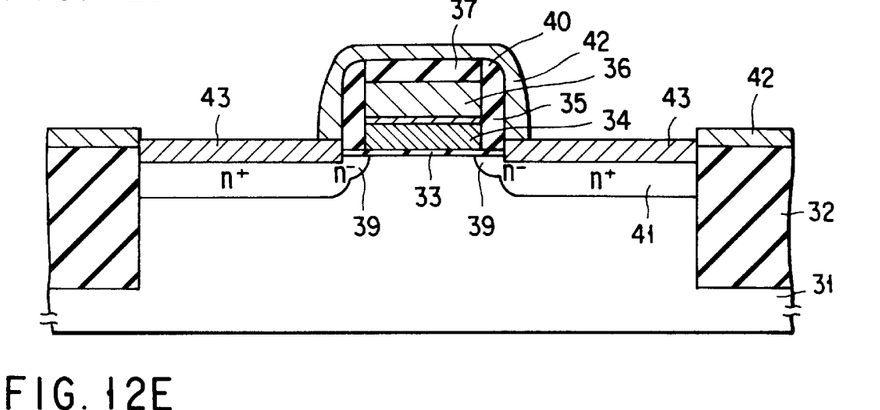

This is followed by a first process of RTA with lamp annealing at 500 to 600° C. for 30 to 60 seconds in the atmosphere of nitrogen. Accordingly, a cobalt silicide (CoSi) layer 43 having a thickness of 28 nm is formed in self-aligned fashion on the n-type source/drain diffusion layer 41 as shown in FIG. 12E.

Figure 13:
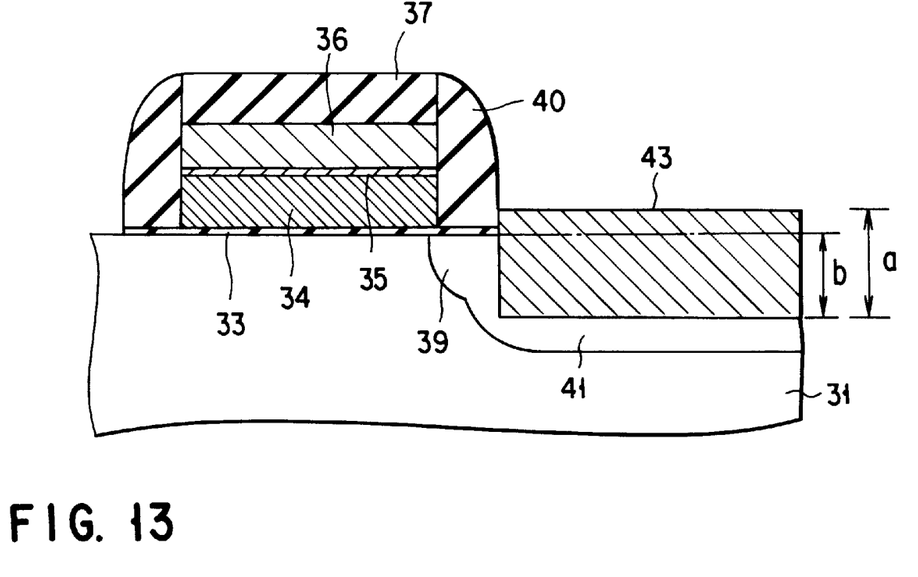
FIG. 13 is a cross sectional view showing the consumption in a source/drain diffusion layer.
Figure 14:
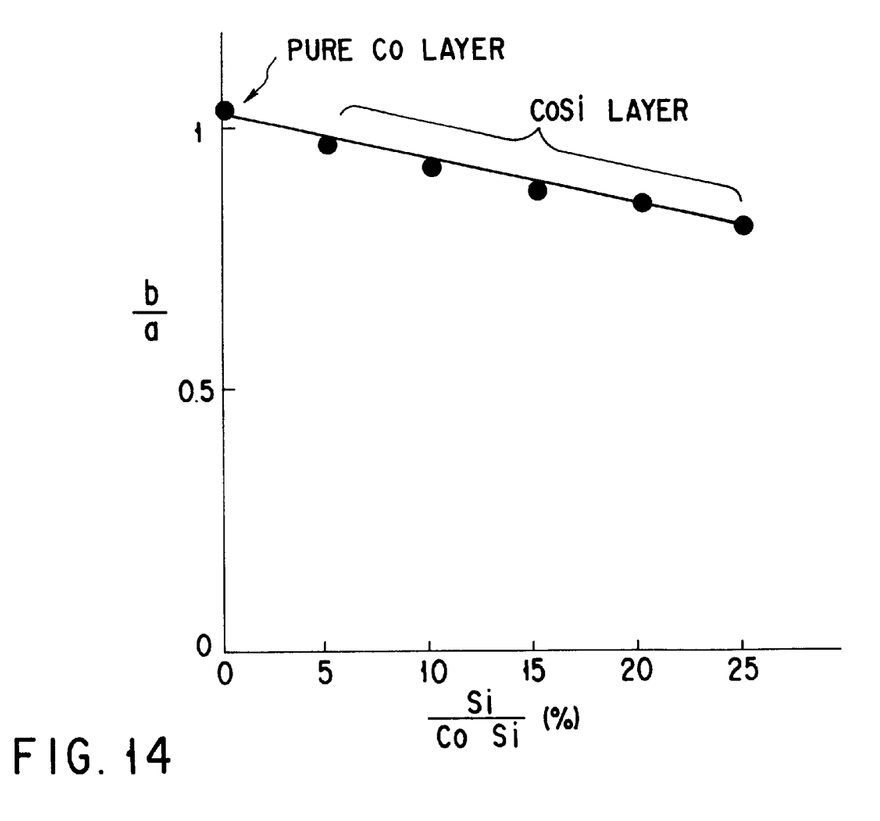
FIG. 14 is a diagram showing the relation between the consumption in the source/drain diffusion layer and the Si concentration.

A resultant structure is shown in cross section in FIG. 13. As shown in FIG. 13, the thickness of the CoSi layer 43 is denoted by "a" and the thickness of a portion of the CoSi layer 43 in the n-type source/drain diffusion layer 41 is denoted by "b". The ratio (b/a) between "a" and "b" is calculated representing the consumption in the n-type source/drain diffusion layer 41, and its relation to the Si concentration is plotted in FIG. 14. The Si concentration is expressed by Si/(Co+Si) (%). As apparent from FIG. 14, the higher the Si concentration the less the consumption in the n-type source/drain diffusion layer 41 is made.

After the first heat treatment, unwanted portions of the Co film 42 including unreacted Si on the insulating layers 32, 37, and 40 are removed by etching. The etching is made using a Co etching solution (a mixture of sulfuric acid solution and hydrogen peroxide solution or a mixture of hydrochloric acid solution, hydrogen peroxide solution, and water).

According to this embodiment, the Co film 42 including Si is formed with the CoSi alloy target of which Si concentration is 10 atomic % and its unwanted portions on the insulation layer 32 and 40 can surely be removed. As the result, the CoSi layer 43 is selectively provided on only the n-type source/drain diffusion layer 41. This is ensured as explained with Embodiment 1.

Figure 12F:
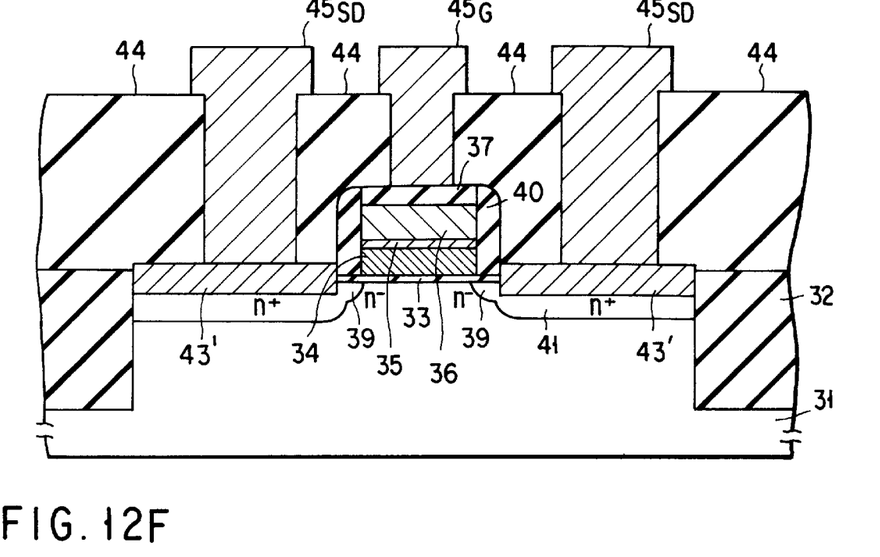

After the unwanted portions of the Co film 42 on the insulation layers are removed, the remaining is subjected to a second process of RTA, for example, at 800 to 900° C. for 30 to 60 seconds. As the result, the CoSi layer 43 having a thickness of 28 nm on the n-type source/drain diffusion layer 41 is converted to a $CoSi_2$ layer 43' having a thickness of 44 nm.

In this embodiment, since the Co layer 42 containing Si is used, the consumption of silicon in the n-type source/drain diffusion layer 41 during the formation of silicide (FIGS. 12E and 12F) can be minimized.

Then, the substrate having the $CoSi_2$ layer 43' thereon is entirely coated with an interlayer insulation layer 44 and predetermined portions of the interlayer insulation layer 44 is removed by etching to form contact holes on the $CoSi_2$ film 43'.

Finally, source/drain wires $45_{SD}$ and a gate wire $45_G$ are patterned to connect across the contact holes to the $CoSi_2$ layer 43' hence completing the MOS transistor of such a structure as shown in FIG. 12F.

The formation of the $CoSi_2$ layer 43' on the silicon substrate in this embodiment starts with depositing the Co film 42 including Si with a sputtering apparatus equipped with the CoSi alloy target of which Si concentration is 10 atomic %. Then, the $CoSi_2$ layer 43' is formed on the n-type source/drain diffusion layer 41 by the heat treatment.

Si contained in the target is transferred to the CoSi alloy film which is deposited by the sputtering. This Si has a function of suppressing the consumption in the n-type source/drain diffusion layer 41 during the formation of silicide layer by the heat treatment. The interface between n-type source/drain diffusion layer 41 and $CoSi_2$ layer 43' is highly planer. Accordingly, when the n-type source/drain diffusion layer 41 is made shallow in the embodiment, leakage current of the pn junction will rarely be increased. More specifically, the $CoSi_2$ layer 43' is formed on the shallow n-type source/drain diffusion layer 41 thus eliminating current leakage of the pn junction.

It would be understood that the present invention is not limited to the prescribed embodiments. Although the embodiments explained previously employ the CoSi or CoTi alloy target as a sputtering target, similar or other appropriate alloy targets may be used with equal success.

The sputtering target may be any combination of as a main component a metal such as Ni, Co, or Fe or an alloy such as Co—Ni, Co—Fe, or Ni—Fe, whichever is magnetic for formation of silicide, and as a sub-component, at least one nonmagnetic metallic element and semiconductor element. In each case, the concentration of the sub-component is preferably less than 33 atomic %.

The sub-component may be selected from, in addition to Si and Ti, Zr, Hf, V, Nb, Ta, Cr, Ge, Sn, or Pb, and their combination.

Mo and W are not suited for use as the sub-component in the sputtering target of the present invention. Those are common refractory metals for formation of silicide but have the following drawback.

Since $MoSi_2$ or $WSi_2$ has a specific resistance of 60 to 80 $\mu\Omega$.cm, its layer will be as thick as about 200 to 267 nm in order to provide a sheet resistance of not more than 3 $\Omega/\square$. Assuming that the thickness of a silicide layer is "c" and the thickness of a portion of the silicide layer consuming the silicon substrate is "d", the ratio of d/c is substantially 1 and the thickness "d" will be about 200 to 267 nm.

If a deep silicide layer is formed on the shallow pn junction which is about not more than 100 nm in depth, a considerable level of the current leakage will occur. Hence, the present invention permits no use of Mo and W.

Although the MOS transistors of n channel type are described with Embodiments 3 and 4, the present invention is equally applicable to a MOS transistor of p channel type.

It is understood that other changes and modifications are possible without departing from the scope of the present invention.

As set forth above, the present invention provides a novel sputtering target suited for formation of a conductive thin film including a magnetic metal or alloy as the main component. Also, the present invention provides a method for fabricating, with ease, a semiconductor device comprising a substrate and a compound layer on its surface, the compound layer containing a component constituting the substrate and a metal and being one capable of forming a flat interface with the substrate.

According to the present invention, the compound layer of which interface with the substrate is highly planer is readily formed on the semiconductor substrate. When the present invention is applied to fabrication of a MOS transistor, a desired silicide layer can be formed on a shallow source/drain diffusion layer with no increase of the leakage of pn junction. This permits each transistor or element to be minimized in size, thus providing a great value in industrial viewpoint.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

I claim:

1. A method of manufacturing a semiconductor device, comprising the steps of:

forming a conductive thin film by sputtering on a semiconductor substrate having a selectively exposed surface, said conductive thin film comprising a main component having magnetic properties and consisting of a metal or an alloy and a sub-component comprising at least one metal capable of reducing a natural oxide film on said semiconductor substrate, heating said semiconductor substrate to react said substrate with said conductive thin film, thereby forming a first compound layer comprising a semiconductor constituting said substrate and the metal constituting said main component of said conductive thin film, removing an unreacted portion of said conductive thin film from said first compound layer on said selectively exposed surface of said semiconductor substrate, and heating said semiconductor substrate to react said substrate with said first compound layer, thereby forming a second compound layer comprising said semiconductor constituting said substrate at a higher ratio than said first compound layer.

2. A method according to claim 1, wherein said main component is a metal selected from the group consisting of Co, Ni, and Fe or an alloy of at least two metals selected from the group consisting of Co, Ni and Fe.

3. A method according to claim 2, wherein said subcomponent comprises at least one nonmagnetic metal selected from the group consisting of Ti, Zr, Hf, V, Nb, Ta and Cr.

4. A method according to claim 3, wherein said subcomponent is used in concentration of less than 33 atomic %.

5. A method according to claim 1, wherein said subcomponent comprises at least one nonmagnetic metal selected from the group consisting of Ti, Zr, Hf, V, Nb, Ta and Cr.

6. A method according to claim 5, wherein said subcomponent is used in concentration of less than 33 atomic %.

7. A method according to claim 1, wherein said semiconductor substrate is a silicon substrate, said selectively exposed surface is a surface of a source/drain diffusion layer of a MOS transistor, said first compound layer is a silicide layer, and said second compound layer is a disilicide layer.

8. A method according to claim 1, wherein a thickness of said second compound layer is 100 nm or less.

9. A method according to claim 8, wherein a thickness of said second compound layer is 15 nm or more.

10. A method according to claim 1, wherein said heating step of forming said first compound layer is performed with lamp annealing at a temperature of 500 to 600° C. for 30 to 60 seconds and said heating step of forming said second compound layer is performed at a temperature of 800 to 900° C. for 30 to 60 seconds.

11. A method of manufacturing a semiconductor device, comprising the steps of:

forming a conductive thin film by sputtering on a semiconductor substrate having a selectively exposed surface, said conductive thin film comprising a main component having magnetic properties and consisting of a metal or an alloy and a sub-component comprising at least one element attenuating a consumption of said semiconductor substrate during reaction between said semiconductor substrate and said conductive thin film to form a compound layer, heating said semiconductor substrate to react said substrate with said conductive thin film, thereby forming a first compound layer comprising a semiconductor constituting said substrate and the metal constituting said main component of said conductive thin film, removing an unreacted portion of said conductive thin film from said first compound layer on said selectively exposed surface of said semiconductor substrate, and heating said semiconductor substrate to react said substrate with said first compound layer comprising said semiconductor constituting said substrate at a higher ratio than said first compound layer.

12. A method according to claim 11, wherein said main component is a metal selected from the group consisting of Co, Ni and Fe or an alloy of at least two metals selected from the group consisting of Co, Ni and Fe.

13. A method according to claim 12, wherein said subcomponent comprises at least one element selected from the group consisting of Sn, Pb, Si and Ge.

14. A method according to claim 13, wherein said subcomponent is used in concentration of less than 33 atomic %.

15. A method according to claim 11, wherein said subcomponent comprises at least one element selected from the group consisting of Sn, Pb, Si and Ge.

16. A method according to claim 15, wherein said subcomponent is used in concentration of less than 33 atomic %.

17. A method according to claim 11, wherein said semiconductor substrate is a silicon substrate, said selectively exposed surface is a surface of a source/drain diffusion layer of a MOS transistor, said first compound layer is a silicide layer, and said second compound layer is a disilicide layer.

18. A method according to claim 11, wherein a thickness of said second compound layer is 100 nm or less.

19. A method according to claim 18, wherein a thickness of said second compound layer is 15 nm or more.

20. A method according to claim 11, wherein said heating step of forming said first compound layer is performed with lamp annealing at a temperature of 500 to 600° C. for 30 to 60 seconds and said heating step of forming said second compound layer is performed at a temperature of 800 to 900° C. for 30 to 60 seconds.

* * * * *